(12) United States Patent
Soofer

(10) Patent No.: US 9,470,384 B2
(45) Date of Patent: Oct. 18, 2016

(54) LIGHTED GLASS BALL

(71) Applicant: Sohrab Robby Soofer, Beverly Hills, CA (US)

(72) Inventor: Sohrab Robby Soofer, Beverly Hills, CA (US)

( * ) Notice: Subject to any disclaimer, the term of this patent is extended or adjusted under 35 U.S.C. 154(b) by 25 days.

(21) Appl. No.: 14/562,362

(22) Filed: Dec. 5, 2014

(65) Prior Publication Data

US 2015/0256126 A1 Sep. 10, 2015

Related U.S. Application Data

(60) Provisional application No. 61/949,959, filed on Mar. 7, 2014.

(51) Int. Cl.

| F21S 6/00 | (2006.01) |
|---|---|
| F21S 9/03 | (2006.01) |
| H01L 31/042 | (2014.01) |
| H02J 7/35 | (2006.01) |
| F21V 3/04 | (2006.01) |
| F21W 121/00 | (2006.01) |
| F21V 23/04 | (2006.01) |
| F21W 131/10 | (2006.01) |
| F21Y 101/00 | (2016.01) |

(52) U.S. Cl.
CPC ............... F21S 9/032 (2013.01); F21S 4/10 (2016.01); F21S 6/00 (2013.01); H01L 31/042 (2013.01); F21V 3/0418 (2013.01); F21V 23/0442 (2013.01); F21W 2121/00 (2013.01); F21W 2131/10 (2013.01); F21Y 2101/00 (2013.01); H02J 7/35 (2013.01); Y02B 10/10 (2013.01)

(58) Field of Classification Search
CPC ...... F21S 9/032; F21S 6/00; F21W 2121/00; F21W 2121/002; F21W 2121/004; F21W 2121/006; F21W 2121/008; F21W 2121/02; F21W 2121/04; F21W 2121/06
See application file for complete search history.

(56) References Cited

U.S. PATENT DOCUMENTS

| 5,217,296 A * | 6/1993 | Tanner ............... F21S 8/00 136/291 |
|---|---|---|
| 6,812,398 B2 * | 11/2004 | Yueh ............... F21S 9/032 136/244 |
| 7,708,424 B2 * | 5/2010 | Richmond ........... G10K 1/07 362/183 |
| 7,726,860 B2 * | 6/2010 | Harrity ............. F21S 6/001 362/555 |
| 9,206,952 B2 * | 12/2015 | Gold ............... F21L 15/08 |

(Continued)

OTHER PUBLICATIONS

Glass Spheres w/Timer by Valerie, Mar. 13, 2014 (exact date is unknown, Examiner can look at dates for video of this item on Youtube).

*Primary Examiner* — Robert May
(74) *Attorney, Agent, or Firm* — Payam Moradian

(57) ABSTRACT

Provided is a luminous sphere comprising a ball with a circular opening and a plug insertable into the ball. A battery container receiving one or more batteries is attached to the plug. A light source in electronic communication with the one or more batteries is enclosed with the inserted plug inside the ball and powered by the batteries to emit light from the ball. The plug can have a switch for activating the light source. The plug can also have one or more circuit boards attached to the plug for controlling power and timing to the light source. The light source can be a string of a plurality of light emitting diodes in series along a wire. A detachable solar panel can be in electronic communication with the one or more batteries. A sensor that turns on the light source when the sensor senses motion can also be provided.

10 Claims, 9 Drawing Sheets

(56) References Cited

U.S. PATENT DOCUMENTS

2002/0176248 A1* 11/2002 Wismeth ............... F21S 9/037
362/159

2010/0244729 A1* 9/2010 Chen .................. F21S 10/04
315/291

2011/0292644 A1* 12/2011 Cohen ................. B44C 5/005
362/183

* cited by examiner

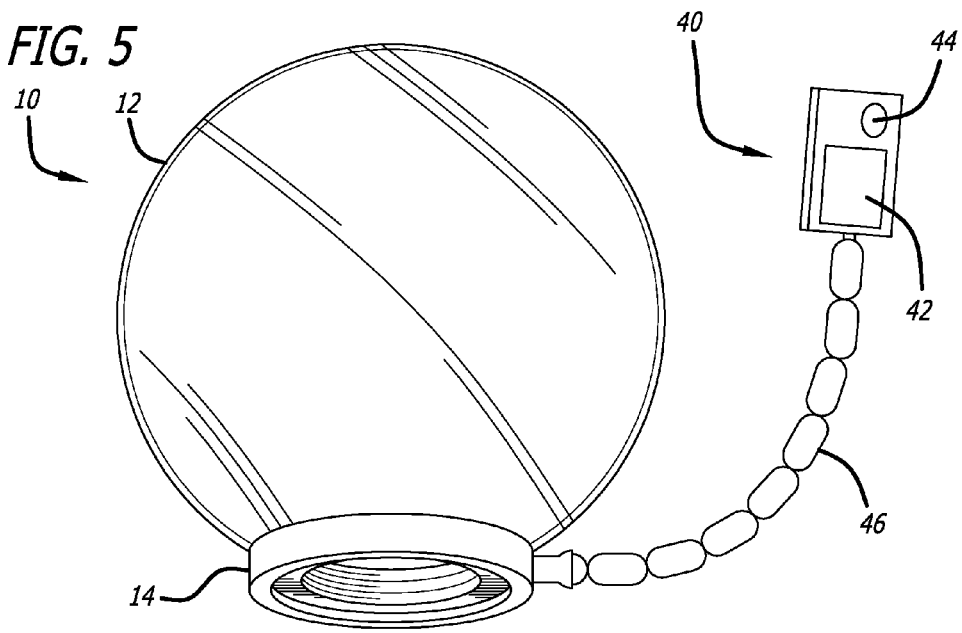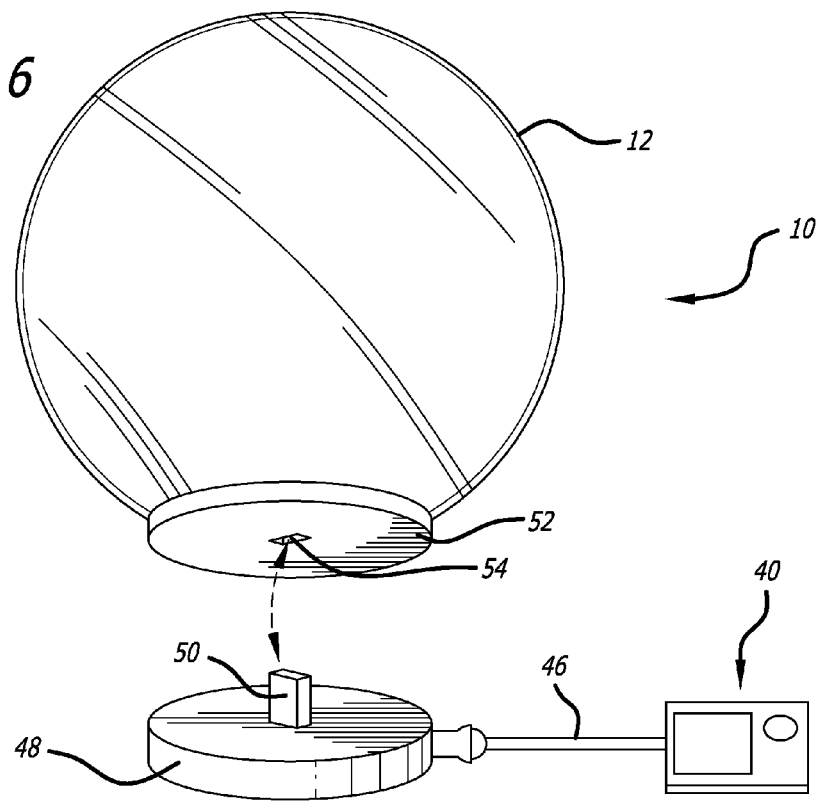

LIGHTED GLASS BALL

CROSS-REFERENCE

The present application claims the benefit of U.S. provisional Appl. No. 61/949,959, filed on Mar. 7, 2014, which is incorporated herein by reference in its entirety.

TECHNICAL FIELD

The present invention is generally directed to a decorative light, more specifically to a luminous sphere.

BACKGROUND SECTION OF THE INVENTION

Decorative lights are a household luxury item used mostly during seasonal holidays, such as Christmas, but they can be displayed year-round. They can be in many shapes and sizes, designed to accent the home whether they are placed on dining tables, fireplace mantels, outdoor patios and lawn, or other places typically seen. However, many decorative light fixtures are not aesthetically pleasing. Moreover, many decorative light fixtures are not waterproof/resistant. Many decorative light fixtures are also not capable of being placed on a surface. Therefore, there is a need for a decorative light fixture that is aesthetically pleasing, resistant to water, and is able to be placed on a surface.

SUMMARY SECTION OF THE INVENTION

It is an object of the present invention to provide a decorative light that is a luminous sphere, the luminous sphere comprising a translucent or transparent ball with a circular opening such that the ball rests on a surface, a plug insertable into the ball having an outer portion accessible from outside the ball and an inner portion remaining inside the ball, a battery container attached to the plug receiving one or more batteries that are enclosed with the inserted plug inside the ball; a light source in electronic communication with the one or more batteries that is enclosed with the inserted plug inside the ball and is powered by the batteries to emit light from the ball, and a switch for activating the light source placed on the outer portion of the plug that is in electronic communication with the one or more batteries and the light source.

In one embodiment of the present invention, there is provided a detachable ring slidably placed around the plug such that when the plug is inserted into the ball, the detachable ring holds the plug in place against the circular opening of the ball. In another embodiment, there is provided a main circuit board attached to the plug for controlling power and timing to the light source and in electronic communication with the switch, the one or more batteries and the light source. In another embodiment, there is provided an intermediate circuit board attached to the plug that is in electronic communication with the switch and the main circuit board.

In one embodiment of the present invention, the ball is made from a cracked glass. In another embodiment, the light source is a string of a plurality of light emitting diodes in series along a wire. In another embodiment, the inner portion is shaped to allow one or more recesses to exist between the outer portion and the inner portion. In another embodiment, there is provided a try-me button attached to the plug that is in electronic communication with the light source such that when the try-me button is pressed, the light source activates. In another embodiment, the try-me button is removable from and re-attachable to the plug.

In one embodiment of the present invention, there is provided a detachable solar panel in electronic communication with the one or more batteries. In another embodiment, the detachable solar panel rests on a surface. In another embodiment, there is provided a sensor that turns on the light source when the sensor senses motion that is in electronic communication with the light source.

It is a further object of the present invention to provide an alternate decorative light that is a luminous sphere, the luminous sphere comprising a translucent or transparent ball with a circular opening, a ring with threads attached to the circular opening such that the ball rests on the ring on a surface, a plug insertable into the ball having an outer portion accessible from outside of the ball and a threaded portion for fastening the plug into the ring to enclose the plug inside the ball, a battery container attached to the plug receiving one or more batteries such that the batteries are enclosed with the plug inside the ball, a light source in electronic communication with the one or more batteries that is enclosed with the plug inside the ball and is powered by the one or more batteries to emit light from the ball, and a switch for activating the light source placed on the outer portion of the plug that is in electronic communication with the one or more batteries and the light source. In one embodiment of the present invention, the outer portion of the plug and the ring form a uniform surface that allows the ball to rest on a surface when the plug is inserted into the ball. In another embodiment, the switch does not contact a surface when the ball is placed on the surface.

It is a further object of the present invention to provide a solar panel having one or more solar cells that convert light into electricity, an arm, and a receiver configured to attach to a light source that is electronically connected to the one or more solar cells via the arm. In one embodiment, the arm is a fixed piece. In another embodiment, the arm is made from small pieces that are pivotally connected to each other that allows for stowing and wrapping the arm around the light source without removing the solar panel. In another embodiment, the solar panel includes a sensor electronically connected to the arm that turns on the light source when the sensor senses motion.

BRIEF DESCRIPTION OF THE DRAWINGS

FIG. 5 illustrates an alternate embodiment of the sphere depicted in FIG. 4.

FIG. 6 illustrates another alternate embodiment of the sphere depicted in FIG. 4.

DETAILED DESCRIPTION OF THE INVENTION

Figure 1:
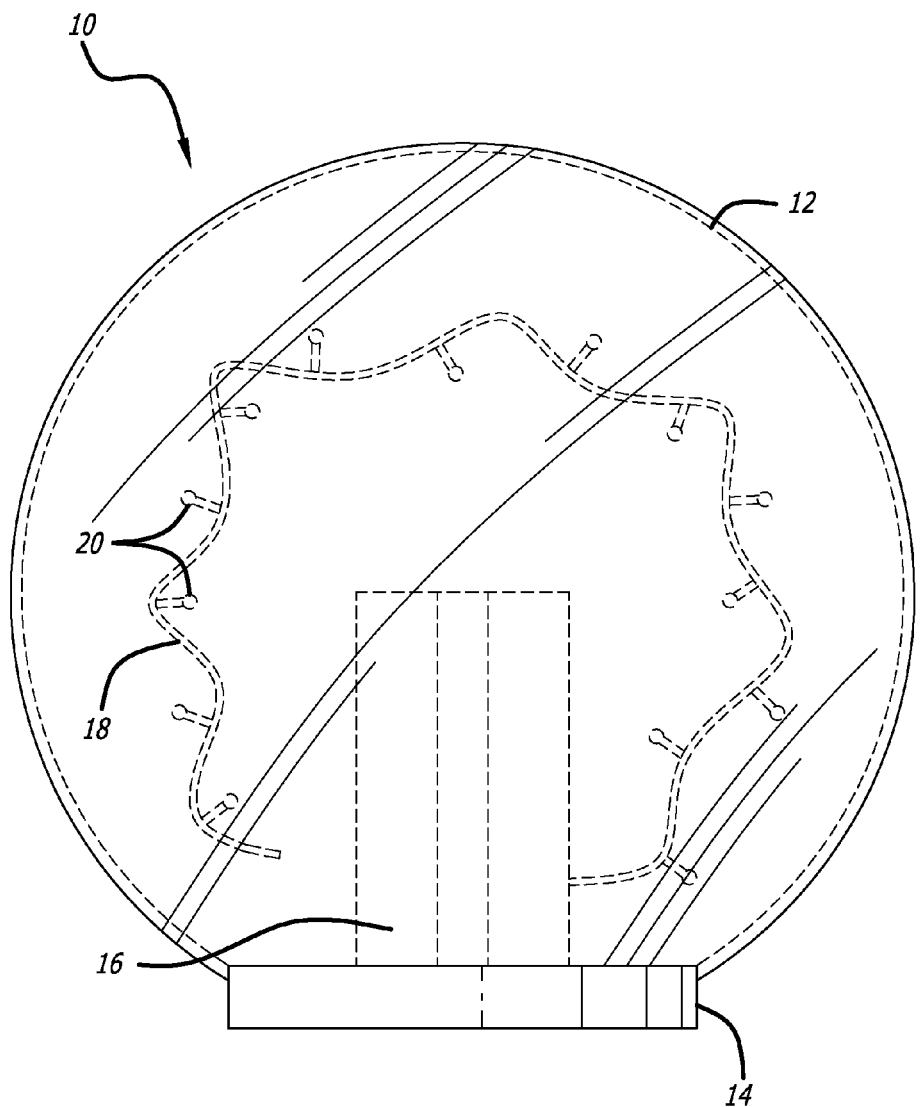
FIG. 1 illustrates a cross-sectional view of an embodiment of a luminous sphere.

FIG. 1 illustrates an embodiment of a luminous sphere 10. The luminous sphere 10 includes a ball 12. At one end of ball 12, there is an opening, preferably circular, where a ring 14 can be attached. The ball 12 can be made from any translucent or transparent material. In one embodiment, the ball 12 is a clear, cracked glass. In another embodiment, ball 12 is a colored cracked glass, such as blue, red, yellow or any color or combination of colors. The ball 12 can be sized such that it has a diameter of about 6 inches to about 18 inches, such as about 12 inches. The ring 14 has a hollow opening through which a plug 16 having a light source 18 can be inserted into ball 12. The light source 18 can be a string of lights 20. The ring 14 can be attached to ball 12 such that ball 12 can rest at an upright position, supported by ring 14, on a surface, such as a table. Ring 14 can be made from a synthetic material such as plastic.

Figure 2:
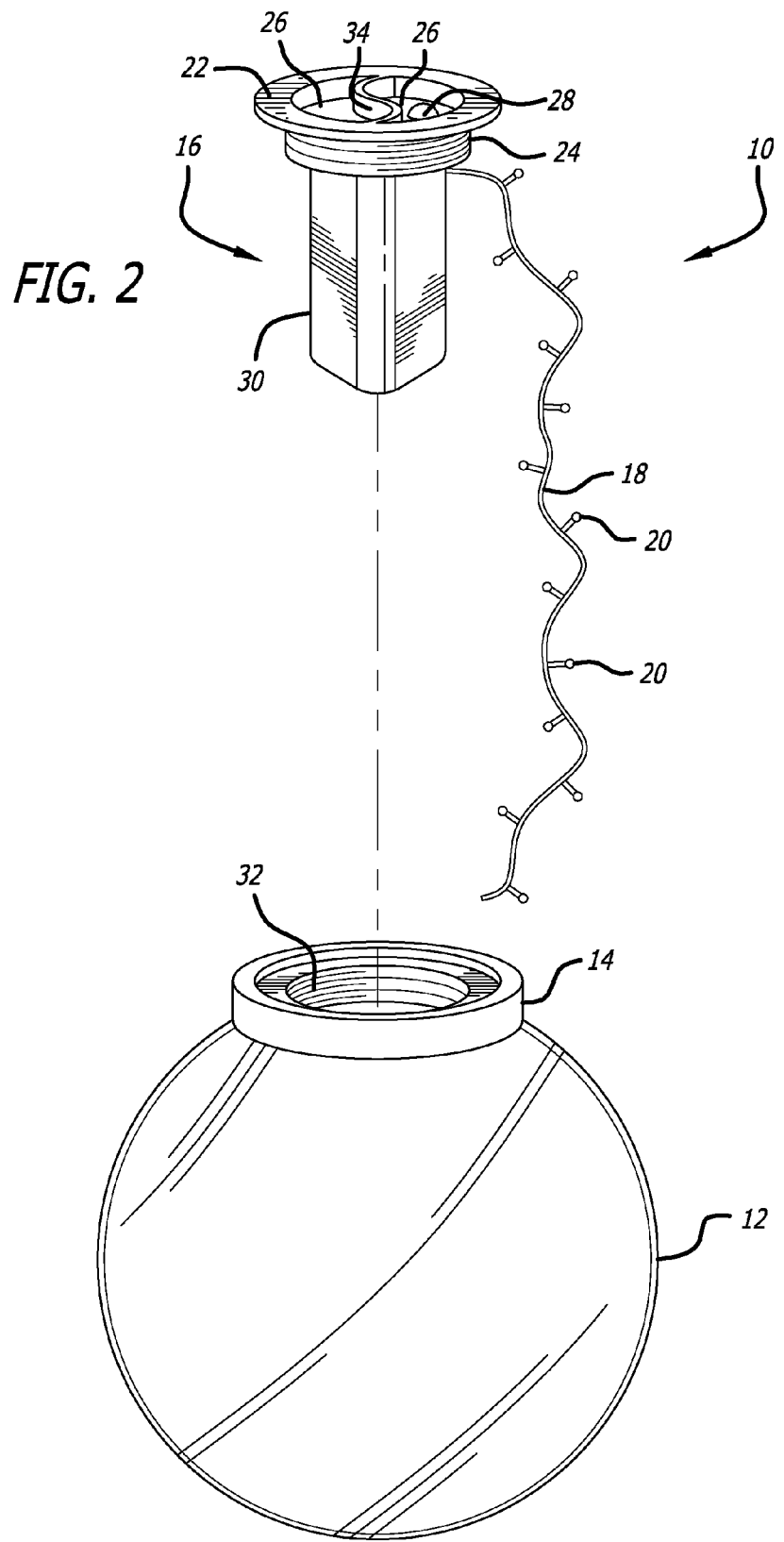
FIG. 2 illustrates a perspective view of a luminous sphere having a threaded plug that is inserted into the ball.

FIG. 2 illustrates an embodiment of the luminous sphere 10 and its interconnectivity to plug 16. Ball 12 can have a circular opening where ring 14 is generally attached. Ring 14 can have inner ring 32 with threads for accepting plug 16. Plug 16 includes an outer portion 22, a threaded portion 24, and an inner portion 30. Inner portion 30 includes a battery container 62 which can hold one or more batteries. Plug 16 can be inserted into ring 14 and threadably fastened such that outer portion 22 connects with ring 14 outside ball 12 thereby forming an enclosure for plug 16 inside ball 12. In an embodiment, the connection between outer portion 22 of plug 16 and ring 14 form a uniform surface on top of which ball 12 can rest upright. Thus the luminous sphere 10 can be placed on any surface, such as a table, with plug 16 enclosed inside ball 12.

The outer portion 22 of plug 16 can include one or more indentations 26. In one embodiment, indentation 26 can be in the shape of a circle with a height ranging from about 0.5 cm to about 1.5 cm inside outer portion 22. Indentation 26 can be divided into multiple portions using divider 34. In one embodiment, divider 34 is s-shaped and thus forms an indentation 26 that resembles a yin-yang. Divider 34 and indentations 26 can be used to facilitate insertion and removal of plug 16 into ball 12. For example, the user can screw and unscrew plug 16 into ball 12 by placing his or her fingers inside the indentations 26 against divider 34. In a preferred embodiment, indentation 26 is positioned inside outer portion 22 such that when plug 16 is twistably inserted into ball 12, outer portion 22 can form a uniform surface with ring 14.

A switch 28 can be placed inside indentation 26 of outer portion 22 to power the luminous sphere 10. In one embodiment, switch 28 is a push button. In a preferred embodiment, switch 28 can have three modes; power on, power off, and timer mode. The switch 28 can be placed inside indentation 26 of outer portion 22 such that switch 28 does not come in contact with a surface when plug 16 is inserted into ball 12 and ball 12 is resting upright on the surface.

Plug 16 is connected to a light source 18. The light source 18, for example, can be a string of lights 20. Each light 20 can be a light-emitting diode (LEDs). Lights 20 can be placed in spaced intervals in series along a wire or string that is in electronic communication with the one or more batteries in battery container 62 within inner portion 30 of plug 16. In one embodiment, battery container 62 can have up to three C batteries. When plug 16 and attached light source 18 are placed inside ball 12, a user can press switch 28 to turn lights 20 on or off, or multiple times to activate a timed pattern.

Figure 3:
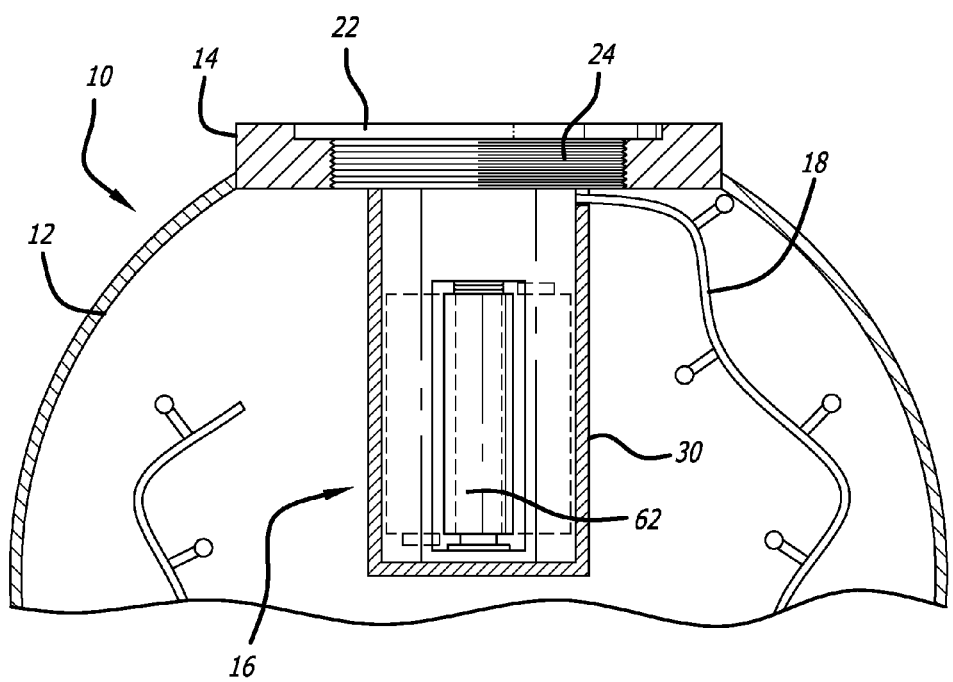
FIG. 3 illustrates a cross-sectional view of a luminous sphere having a threaded plug inserted into and enclosed inside the sphere.

FIG. 3 illustrates the luminous sphere 10 when the plug 16 and the light source 18 is fully placed within ball 12. When plug 16 is threadably inserted into ring 14 of ball 12, outer portion 22 levelly aligns with ring 14 to form a uniform surface, enclosing plug 16 within ball 12.

Figure 7:
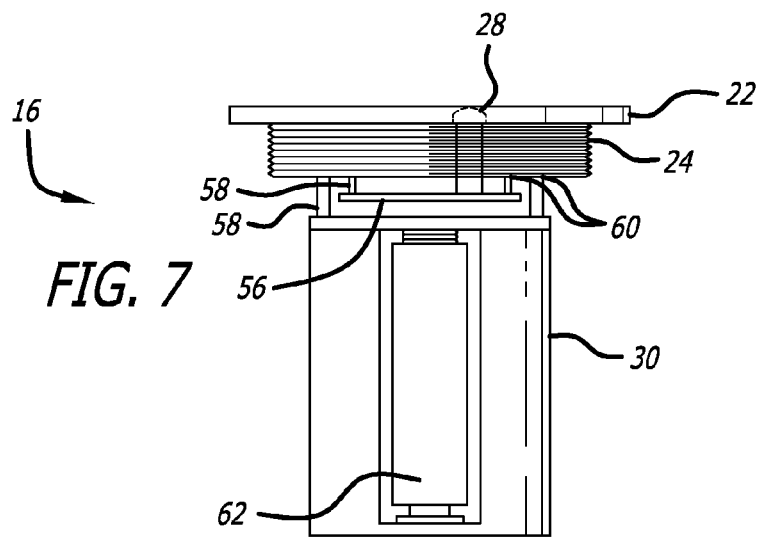
FIG. 7 illustrates a cross-sectional view of the threaded plug having a circuit board and a battery compartment.

FIG. 7 illustrates an embodiment of plug 16. Plug 16 includes an outer portion 22, a threaded portion 24, and an inner portion 30. Threaded portion 24 has threads complementary to the threads of inner ring 32 in ring 14, thus allowing plug 16 to be threadably fastened into ball 12. Outer portion 22 can be of a greater diameter than threaded portion 24, and complementarily, ring 14 can be of a greater diameter than inner ring 32, thereby forming an enclosure when plug 16 is inserted into ball 12.

Inner portion 30 can include a circuit board 56 and a battery container 62. Circuit board 56 and batteries in battery container 62 can be in electronic communication with each other. Light source 18 can be attached to plug 16 such that light source 18 is electronically connected to circuit board 56 and battery container 62. Battery container 62 can be connected to circuit board 56, for example, through an opening allowing for passage of copper wires to be soldered onto circuit board 56.

Circuit board 56 and battery container 62 can be fastened to plug 16 using fasteners 58, such as screws, and receivers 60, such as screw holes. Threaded portion 24 can include a flat surface on which a plurality of receivers 60 are placed for receiving fasteners 58 to attach circuit board 56 and battery container 62. Fasteners 58 can be spaced and sized such that the fasteners attaching circuit board 56 to threaded portion 24 are of a different height than the fasteners attaching battery container 62 to threaded portion 24. In one embodiment, the plurality of receivers 60 or screw holes for fastening can be arranged such that the circuit board 56 is attached and placed between the receivers 60 for fastening the battery container 62. In an embodiment having switch 28, an opening transverses plug 16 between outer portion 22 and circuit board 56 such that switch 28 is in electronic communication with circuit board 56.

Alternatively, the positions of the circuit board 56 and battery container 62 can be reversed, such that circuit board 56 is attached outside plug 16. In one embodiment, circuit board 56 is fastened to battery container 62 using fasteners 58 which are connected to complementary receivers 60. In another embodiment, circuit board 56 is fastened to battery container 62 using an adhesive material such as tape or glue. In an embodiment, circuit board 56 can be electrically connected to the batteries in battery container 62 using one or more wires that can run along the outside of battery container 62.

The battery container 62 can receive one or more batteries. In one embodiment, the battery container 62 can receive three C batteries in parallel fashion to each other. Each battery can be separated from another battery with a divider and have its own anode and cathode. The batteries can be connected in series and be in electronic communication with the circuit board 56 and the light source 18. The battery container 62 can have a cover or a lid for keeping the battery container in place, for example, an elastic plastic or rubber material. Battery container 62 can be detachably attached to plug 16 using fasteners 58 and receivers 60. In one embodiment, battery container 62 can be fastened to plug 16 using three fasteners 58 that are placed in a triangular orientation on the periphery of battery container 62 to be inserted into three receivers 60 placed in complementary orientation on the flat surface of threaded portion 24.

Figure 8:
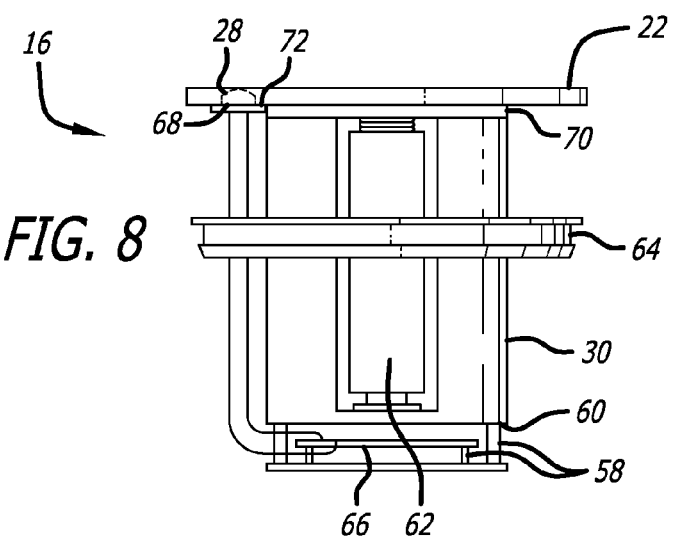
FIG. 8 illustrates a cross-sectional view of a non-threaded plug with a detachable ring.
Figure 9:
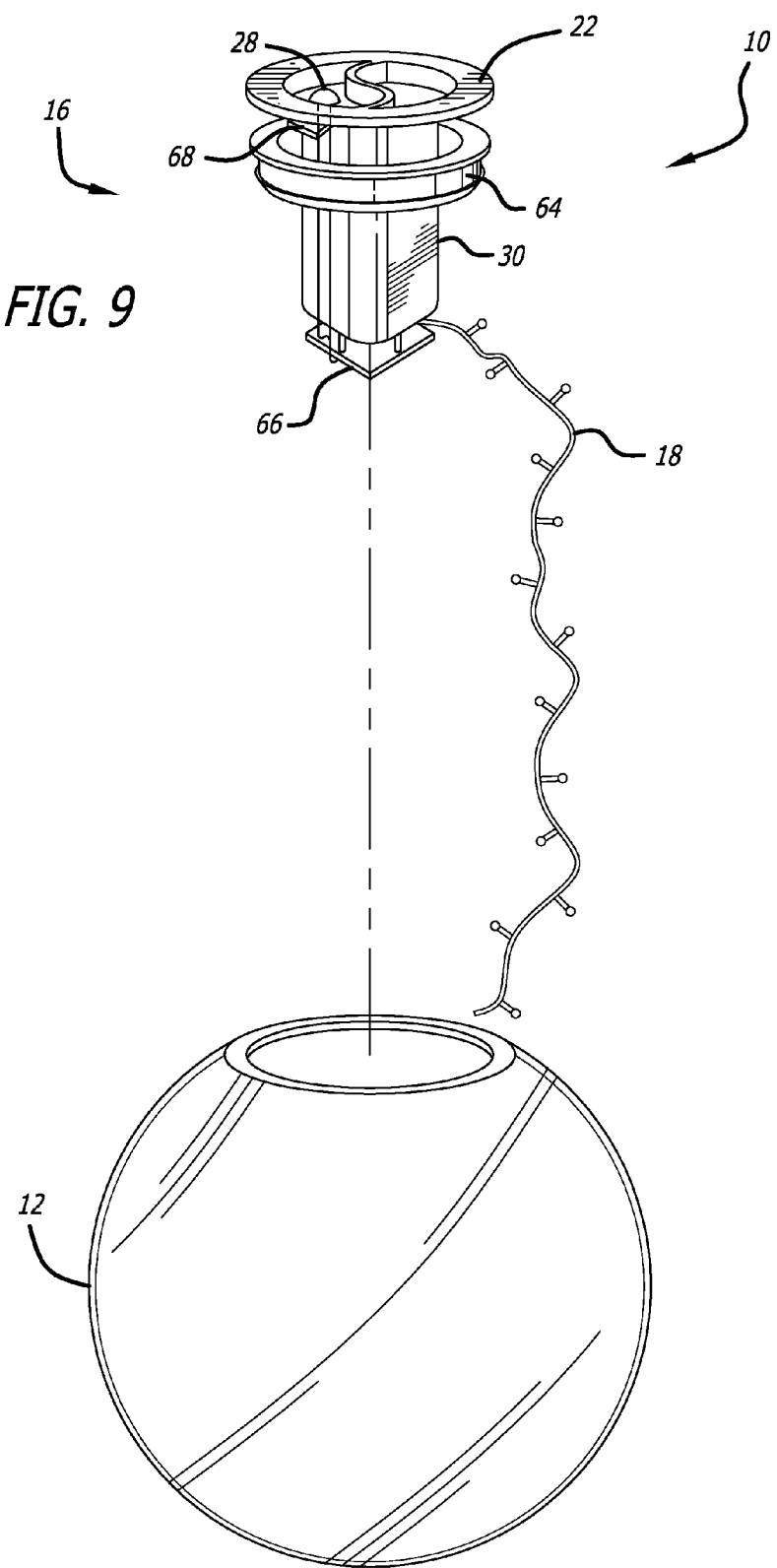
FIG. 9 illustrates a perspective view of a luminous sphere having the non-threaded plug with detachable ring depicted in FIG. 8.

FIGS. 8 and 9 illustrate an alternate, non-threaded embodiment of plug 16 in the luminous sphere 10. In this embodiment, luminous sphere 10 includes a ball 12 having a circular opening and a plug 16. Plug 16 includes an outer portion 22 and an inner portion 30, the plug 16 attached to a light source 18. Plug 16 can also include an intermediate portion 70 situated between outer portion 22 and inner portion 30. One or more recesses 72 can exist around the junction between outer portion 22 and inner portion 30, or alternatively where intermediate portion 70 exists, between intermediate portion 70 and inner portion 30. No threaded portion exists in this embodiment; rather, plug 16 can be pressed and enclosed inside ball 12 without requiring threads by pressing plug 16 inside the circular opening.

FIG. 8 illustrates that to detachable ring 64 can be slidably attached to plug 16 between outer portion 22 and inner portion 30 to hold plug 16 in place against the circular opening of ball 12 when plug 16 is pressed inside ball 12. Detachable ring 64 can be a synthetic material, such as plastic. In one embodiment, detachable ring 64 can take an annular shape, such as a ring, having a diameter compatible with that of the circular opening of ball 12 such that the detachable ring 64 can be pushed inside and held against the circular opening of ball 12. Plug 16 with attached light source 18 can be inserted within detachable ring 64 such that outer portion 22 aligns with detachable ring 64 to form a uniform surface for ball 12 to rest upright, with plug 16 and the light source 18 enclosed inside ball 12.

The inner portion 30 of plug 16 can include a battery container 62 and a main circuit board 66. The battery container 62 can receive one or more batteries. In one embodiment, the battery container 62 can receive three C batteries in parallel fashion to each other. Each battery can be separated from another battery with a divider and have its own anode and cathode. The batteries can be connected in series and be in electronic communication with the main circuit board 66 and the light source 18. Battery container 62 can be detachably inserted and contained inside inner portion 30 through the opening inside outer portion 22. The battery container 62 can have a cover or a lid for keeping the battery container 62 in place, for example, a latched plastic lid attached to outer portion 22.

Main circuit board 66 can be configured to control power and timing for the light source 18. Main circuit board 66 can be attached to an outside face of inner portion 30 using a fastener such as one or more screws, an adhesive such as tape or glue, or a combination of each. Main circuit board 66 can be electronically connected to the battery container 62 and light source 18 using one or more wires.

The outer portion 22 of plug 16 can include one or more indentations 26. In one embodiment, indentation 26 can be in the shape of a circle with a height ranging from about 0.5 cm to about 1.5 cm inside outer portion 22. A switch 28 can be placed inside indentation 26 of outer portion 22 to power the luminous sphere 10. In one embodiment, switch 28 is a push button. In a preferred embodiment, switch 28 can have three modes: power on, power off, and timer mode. The switch 28 can be placed inside indentation 26 of outer portion 22 such that switch 28 does not come in contact with a surface when plug 16 is inserted into ball 12 and ball 12 is resting upright on the surface.

Switch 28 is in electronic communication with the main circuit board 66 and light source 18. In a preferred embodiment, switch 28 can be connected to main circuit board 66 via an intermediate circuit board 68 that is attached to a recess 72 between the outer portion 22 and inner portion 30. Intermediate circuit board 68 can be attached using a fastener such as one or more screws, an adhesive such as tape or glue, or a combination of each. An opening transverses plug 16 between outer portion 22 and intermediate circuit board 68 such that switch 28 is in electronic communication with intermediate circuit board 68. One or more wires in electronic communication between intermediate circuit board 68 and main circuit board 66 can run along the outside of plug 16, thereby electronically connecting switch 28 to main circuit board 66 and light source 18.

As shown in FIG. 9, the light source 18 can be a string of lights 20. Each light 20 can be a light-emitting diode (LEDs). Lights 20 can be placed in spaced intervals in series along a wire or string that is in electronic communication with main circuit board 66 and with the one or more batteries in battery container 62 within inner portion 30 of plug 16. When plug 16 and attached light source 18 are placed and held inside ball 12 using detachable ring 64, a user can press switch 28 to turn lights 21 on or off, or multiple times to activate a timed pattern.

Figure 10A:
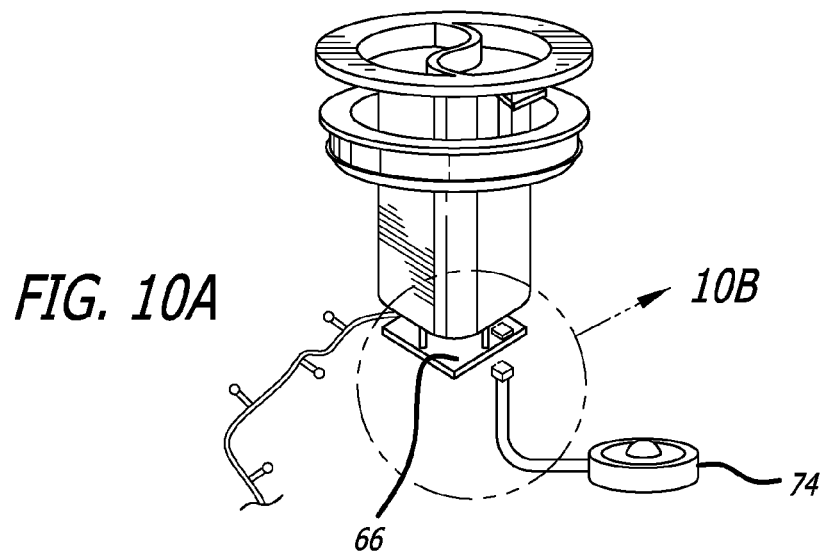
FIG. 10A illustrates a non-threaded plug with a detachable ring having a try-me button.
Figure 10B:
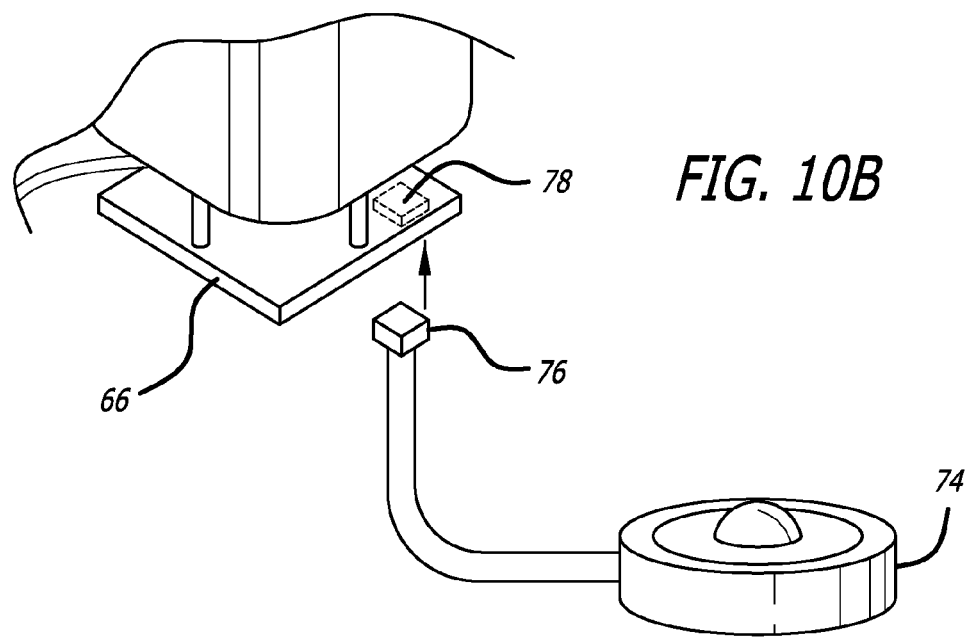
FIG. 10B illustrates a close-up view of the try-me button of FIG. 10A.

FIGS. 10A and 10B illustrate that plug 16 can optionally be electronically connected using one or more wires to a try-me button 74. Try-me button 74 can be generally attached to plug 16 in electronic communication with the light source 18. Alternatively, try-me button 74 can be attached to main circuit board 66, from where it is electronically connected to light source 18. The try-me button 74 can exist and be optionally electronically connected whether the plug 16 is threaded, as in FIG. 7, or not threaded, as in FIG. 8.

The try-me button 74 can be a push-button switch that turns on or off the light source 18. In one embodiment, try-me button 74 turns the light source 18 on while pressed, and turns the light source 18 off when released. When plug 16 is inserted into ball 12 such that light source 18 is enclosed within ball 12, try-me button 74 can remain accessible outside ball 12 for a user to try out the luminous sphere 10.

FIG. 10B closely illustrates an embodiment describing the interconnectivity of try-me button 74 with main circuit board 66. Try-me button 74 can include a try-me plug 76 adapted to electronically connect try-me button 74 to light source 18. Main circuit board 66 can include a try-me jack 78 adapted to electronically receive try-me plug 76. When try-me plug 76 is inserted into try-me jack 78, try-me button 74 can electronically communicate with main circuit board 66 and light source 18. Similarly, if try-me plug 76 is released from try-me jack 78, try-me button 74 loses electronic communication with main circuit board 66 and light source 18.

Figure 4:
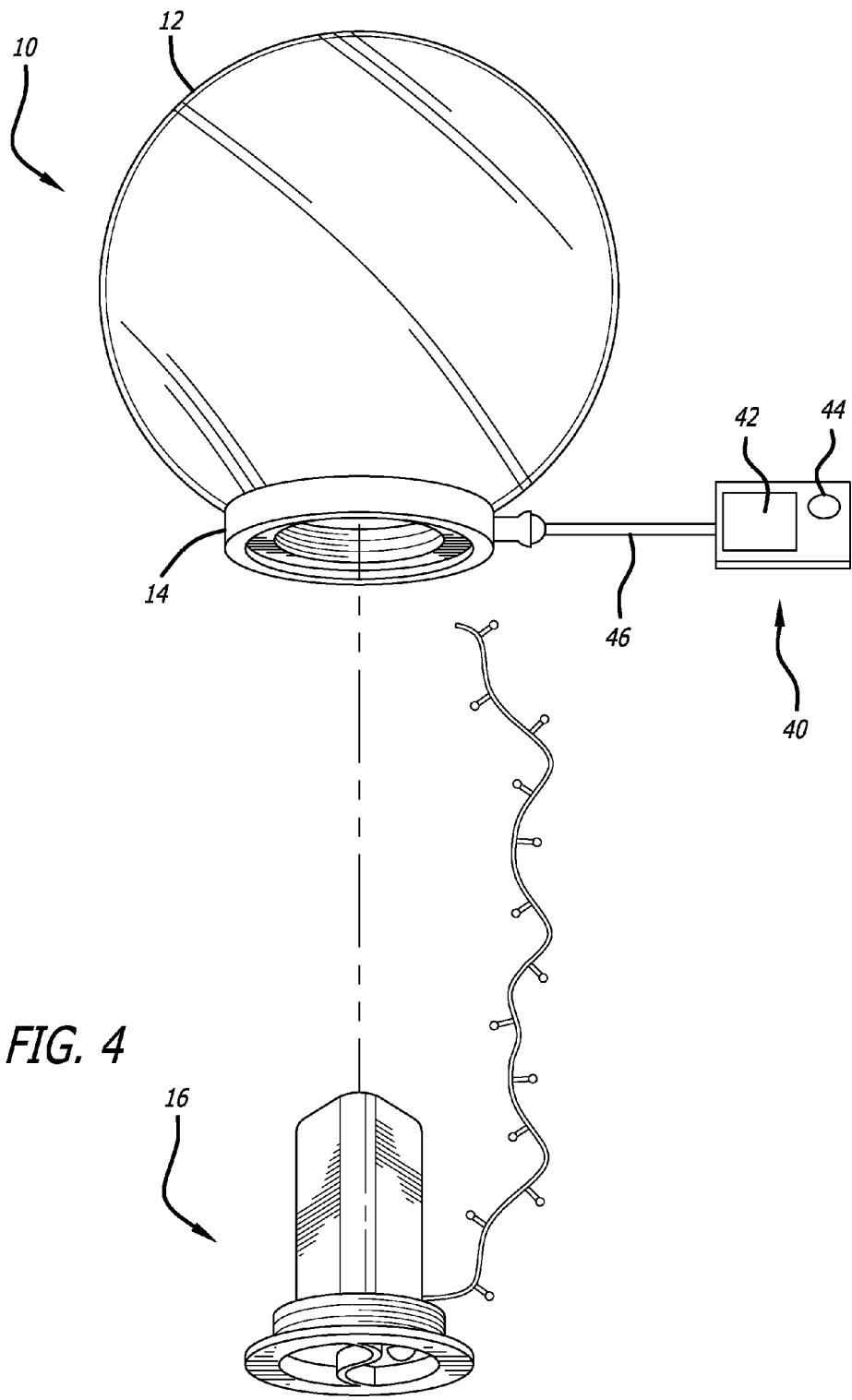
FIG. 4 illustrates a perspective view of an alternate embodiment of a luminous sphere having an attached solar panel and sensor.

FIGS. 4-6 describe an embodiment of the luminous sphere 10 having a detachable solar panel 40 and/or a sensor 44. The luminous sphere 10 having a detachable solar panel 40 and/or sensor 44 can include both the threaded and non-threaded variations of plug 16 previously described. In one embodiment, the luminous sphere 10 can include a detachable solar panel 40, the solar panel 40 containing one or more solar cells 42, that is attached to ball 12. The detachable solar panel 40 extends in a direction away from ball 12 and receives sunlight for conversion to electricity for charging the batteries in battery container 62 when plug 16 is inserted into ball 12. In another embodiment, the luminous sphere 10 can include a motion sensor 44 that turns on the light source 18 when sensor 44 senses motion. The sensor 44 can be contained within detachable solar panel 40. In a preferred embodiment, detachable solar panel 40 can rest on a surface.

In the embodiments of FIGS. 4 and 5, a solar panel 40 containing solar cells 42 and sensor 44 can be attached to ring 14 of ball 12 using an arm 46. As illustrated in FIG. 4, arm 46 can be one fixed piece, or alternatively as shown in FIG. 5, arm 46 can be made from small pieces that are pivotally connected to each other, which allows for pivotally wrapping arm 46 around the ring 14. The pivotal movement allows for extending or stowing the arm 46 without removing the solar panel 40. The solar panel 40 and sensor 44 can be electronically connected to the battery container 62, the circuit board 56, and the light source 18 through an opening in ring 14 via arm 46 when plug 16 is inserted into ball 12. When plug 16 is inserted into ball 12, solar panel 40 can thus charge the batteries in battery container 62. When a solar panel 40 is not desired, the opening of the ring 14 can be closed.

FIG. 6 describes an alternative embodiment of a luminous sphere 10 with solar panel 40 using a receiver 48. Receiver 48 can be connected to solar panel 40 through an arm 46. Arm 46 can be one fixed piece, or alternatively, arm 46 can be made from small pieces that are pivotally connected to each other, which allows for the pivotally wrapping arm 46 around the receiver 48. The pivotal movement allows for extending or stowing the arm 46 without removing the solar panel 40. Receiver 48 can have a protruding connector 50. The solar cells 42 and optional sensor 44 in solar panel 40 can be electronically connected to the connector 50 through an opening in receiver 48 via arm 46.

As FIG. 6 illustrates, ball 12 can include a ring 52 having an opening 54. Ball 12 can rest upright on ring 52 on a surface. Ball 12 can be placed upon receiver 48 by positioning the ring 52 on top of receiver 48 such that connector 50 insertably engages with opening 54. A light source 18, a battery container 62, and a circuit board 56 can be situated inside ball 12 such that they electronically connect to solar panel 40 when the ball 12 is placed on receiver 48. Thus, when ball 12 is placed an top of receiver 48, solar panel 40 can charge the batteries in battery container 62. A removable part can be inserted into opening 54 when solar panel 40 is not being used. When use of solar panel 40 is desired, the removable part can be removed from opening 54. Thus, the luminous sphere 10 can be used with or without the solar panel 40 as desired by a user.

Figure 11:
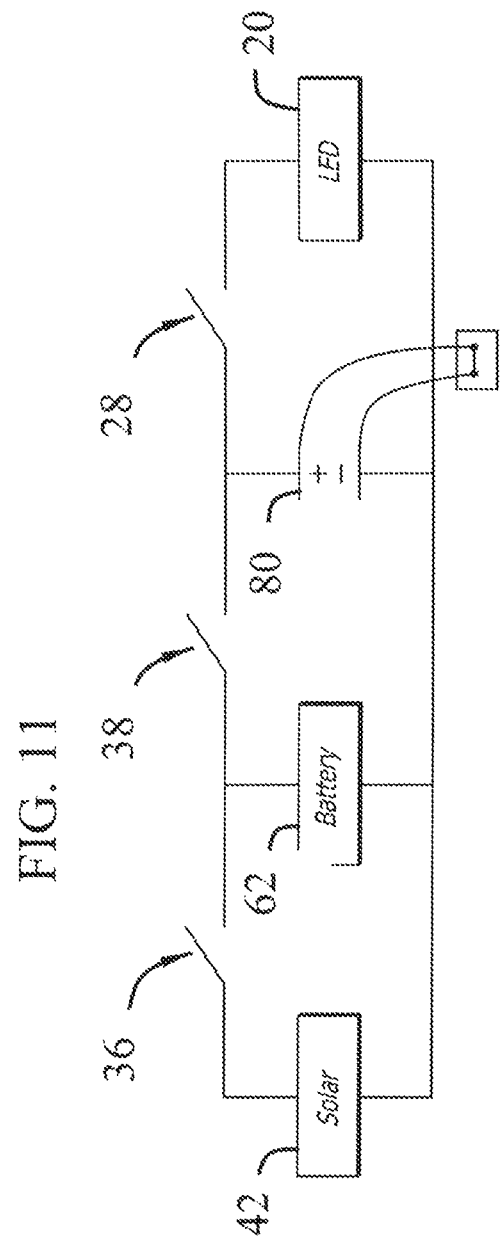
FIG. 11 illustrates an exemplary circuit diagram of control circuitry in a solar panel.

FIG. 11 illustrates an exemplary circuit diagram of control circuitry in the solar panel 40. In the solar panel 40, there is provided solar cells 42 and an optional connection to at external source of electricity 80 such as from an electrical outlet. The lights 20 attached to light source 18 and batteries in battery container 62 can be electronically connected to the control circuitry either when plug 16 is inserted into ball 12, as depicted in the embodiments of FIGS. 4-5, or alternatively when ball 12 is placed on top of receiver 48, as depicted in the embodiment of FIG. 6. The flow of current is controlled by switch 28, which is the on-off switch, and internal switches 36 and 38. In one embodiment, on-off switch 28 can be an internal switch. In another embodiment, on-off switch 28 can be an external killer switch.

On-off switch 28 can be controlled externally, while the states of internal switches 36 and 38 change depending on internal factors. For example, when there is no external source of electricity 80, internal switches 36 and 38 sense whether the solar cells 42 are detecting light and thus generating a voltage. If so, such as during the daytime, internal switch 36 closes, internal switch 38 opens, and the solar cells 42 recharge the batteries. In this setup, power will not flow to the lights 20. If the solar cells 42 do not sense light, such as during the night time, then the internal switch 36 opens, internal switch 38 closes, and power flows from the batteries in battery container 62 to the lights 20, assuming the on-off switch 28 is on. If the on-off switch 28 is off (open), power does not flow to the light source 18. On-off switch 28 can be on (closed) at all time if desired.

When an external source of electricity 80 is used, power is provided to the light source 18 from the external source of electricity 80 regardless of outside lighting conditions, assuming the on-off switch 28 is on. If internal switches 36 and/or 38 sense that there is an external source of electricity 80, such as by detecting its voltage, then internal switch 36 opens and disconnects the solar cells 42 from the circuit. In another embodiment, if internal switches 36 and/or 38 sense that the charge in the batteries in battery container 62 are low, then internal switch 38 closes so that the external source of electricity 80 can power the light source 18 and recharge the batteries. Alternatively, if the batteries are not low, then internal switch 38 opens and disconnects the batteries from the circuit.

What is claimed is:

1. A luminous sphere, comprising:
   a) a translucent or transparent ball with a single circular opening;
   b) a plug insertable into the ball, the plug having an outer portion and an inner portion, the outer portion accessible from outside the ball after the plug is inserted into the ball through the circular opening, the inner portion remaining inside the ball;
   c) a battery container attached to the inside portion of the plug, the battery container receiving one or more batteries such that when the plug is inserted into the ball, the batteries are enclosed with the plug inside the ball;
   d) a light source in electronic communication with the one or more batteries such that when the plug is inserted into the ball, the light source is enclosed with the plug inside the ball;
   e) a switch for activating the light source placed in a cavity on the outer portion of the plug and not making contact with a surface when the plug is placed on the surface, the switch in electronic communication with the one or more batteries and the light source, the switch transversing an opening in the plug in electronic communication with an intermediate circuit board attached to the inside portion of the plug;
   f) a detachable ring placed around the plug, the detachable ring placed such that when the plug is inserted into the ball, the detachable ring holds the plug in place against the circular opening of the ball; and
   g) a main circuit board placed on a top of the plug for controlling power and timing to the light source, the main circuit board in electronic communication with the switch, the one or more batteries and the light source, and the circuit board in electronic communication with the switch, wherein the light source is powered by the one or more batteries, the light source emitting light from the ball.

2. The luminous sphere of claim 1, wherein the ball is made from a cracked glass.

3. The luminous sphere of claim 1, wherein the light source is a string comprising a plurality of light emitting diodes in series along a wire.

4. The luminous sphere of claim 1, wherein the inner portion is shaped to allow one or more recesses to exist.

5. The luminous sphere of claim 1, wherein the inner portion is shaped to allow one or more recesses to exist, the intermediate circuit board placed in the one or more recesses.

6. The luminous sphere of claim 1 further comprising a try-me button attached to the plug, the try-me button in electronic communication with the light source such that when the try-me button is pressed, the light source activates.

7. The luminous sphere of claim 6, wherein the try-me button is removable from and re-attachable to the plug.

8. The luminous sphere of claim 1, further comprising a detachable solar panel in electronic communication with the one or more batteries.

9. The luminous sphere of claim 8, wherein the detachable solar panel rests on a surface.

10. The luminous sphere of claim 1, further comprising a sensor that turns on the light source when the sensor senses motion, the sensor in electronic communication with the light source.

* * * * *